(12) United States Patent
Shin et al.

(10) Patent No.: US 11,588,046 B2
(45) Date of Patent: Feb. 21, 2023

(54) HIGH ELECTRON MOBILITY TRANSISTOR

(71) Applicant: Samsung Electronics Co., Ltd., Suwon-si (KR)

(72) Inventors: Dongchul Shin, Suwon-si (KR); Boram Kim, Hwaseong-si (KR); Younghwan Park, Seongnam-si (KR); Jongseob Kim, Seoul (KR); Joonyong Kim, Seoul (KR); Junhyuk Park, Pohang-si (KR); Jaejoon Oh, Seongnam-si (KR); Minchul Yu, Suwon-si (KR); Soogine Chong, Seoul (KR); Sunkyu Hwang, Seoul (KR); Injun Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/386,729

(22) Filed: Jul. 28, 2021

(65) Prior Publication Data

US 2022/0310833 A1    Sep. 29, 2022

(30) Foreign Application Priority Data

Mar. 29, 2021    (KR) .................... 10-2021-0040540

(51) Int. Cl.
*H01L 29/778*    (2006.01)
*H01L 29/205*    (2006.01)
*H01L 29/20*    (2006.01)

(52) U.S. Cl.
CPC ...... *H01L 29/7785* (2013.01); *H01L 29/2003* (2013.01); *H01L 29/205* (2013.01)

(58) Field of Classification Search
CPC ......... H01L 29/66431; H01L 29/66462; H01L 29/778–7789
See application file for complete search history.

(56) References Cited

U.S. PATENT DOCUMENTS

| | | | |
|---|---|---|---|
| 8,436,398 B2 | 5/2013 | Lidow et al. | |
| 8,816,396 B2 | 8/2014 | Hwang et al. | |
| 9,117,890 B2 | 8/2015 | Kim et al. | |
| 10,686,052 B2 | 6/2020 | Stoffels | |
| 11,101,355 B2 | 8/2021 | Shimizu | |
| 2005/0274980 A1 | 12/2005 | Miyoshi | |
| 2010/0258841 A1 | 10/2010 | Lidow et al. | |

(Continued)

FOREIGN PATENT DOCUMENTS

JP          2018-014457 A        1/2018

OTHER PUBLICATIONS

Office Action dated Aug. 22, 2022 issued in corresponding Korean patent application No. 10-2021-0040540.

*Primary Examiner* — Eric A. Ward
(74) *Attorney, Agent, or Firm* — Harness, Dickey & Pierce, P.L.C.

(57) ABSTRACT

A high electron mobility transistor (HEMT) includes a channel layer, a plurality of barrier layers, and a p-type semiconductor layer. The barrier layers have an energy band gap greater than that of the channel layer. A gate electrode is arranged on the p-type semiconductor layer. A source electrode and a drain electrode are apart from the p-type semiconductor layer and the gate electrode on the barrier layers. Impurity concentrations of the barrier layers are different from each other in a drift area between the source electrode and the drain electrode.

20 Claims, 10 Drawing Sheets

(56) References Cited

U.S. PATENT DOCUMENTS

| | | | |
|---|---|---|---|
| 2015/0123139 A1* | 5/2015 | Kim | H01L 29/66462 438/172 |
| 2015/0263154 A1* | 9/2015 | Fujimoto | H01L 29/7786 438/172 |
| 2016/0056245 A1* | 2/2016 | Kinoshita | H01L 29/66462 438/191 |
| 2019/0229203 A1 | 7/2019 | Iucolano | |

* cited by examiner

HIGH ELECTRON MOBILITY TRANSISTOR

CROSS-REFERENCE TO RELATED APPLICATION

This application is based on and claims priority under 35 U.S.C. § 119 to Korean Patent Application No. 10-2021-0040540, filed on Mar. 29, 2021 in the Korean Intellectual Property Office, the disclosure of which is incorporated by reference herein in its entirety.

BACKGROUND

1. Field

The present disclosure relates to high electron mobility transistors (HEMTs), and more particularly, to HEMTs having normally-off characteristics.

2. Description of the Related Art

In a power conversion system, the efficiency of a power switching element influences the efficiency of an entire system. As a switching element, a metal oxide semiconductor field effect transistor (MESFET) or an insulated gate bipolar transistor (IGBT) using silicon is generally used. However, due to the material limit of silicon itself, there is a limitation in increasing the efficiency of the switching element. As an attempt to escape the material limit of silicon, a high electron mobility transistor (HEMT) has been actively studied.

An HEMT includes semiconductor layers having different electrical polarization characteristics from each other. In the HEMT, a semiconductor layer having a relatively great polarization rate may cause a two-dimensional electron gas (2DEG) in another semiconductor layer hetero-joined thereto. The 2DEG is used as a channel between a drain electrode and a source electrode, and a current flowing through the channel is controlled by a bias voltage applied to a gate electrode. An HEMT having a typical structure, for example, an HEMT using a heterojunction with Group III nitride semiconductors, has normally-on characteristics. In order to implement an HEMT having normally-off characteristics, a gate semiconductor layer forming a depletion region in a channel is employed.

SUMMARY

Provided are high electron mobility transistors (HEMTs) having stable normally-off characteristics.

Provided are HEMTs having a low resistance in an on state.

Additional aspects will be set forth in part in the description which follows and, in part, will be apparent from the description, or may be learned by practice of the presented embodiments of the disclosure.

According to an embodiment, an HEMT includes a channel layer, a plurality of barrier layers on the channel layer and having an energy band gap greater than that of the channel layer, a p-type semiconductor layer on the plurality of barrier layers, a gate electrode on the p-type semiconductor layer, and a source electrode and a drain electrode spaced apart from the gate electrode on the channel layer, wherein impurity concentrations of the plurality of barrier layers are different from each other in a drift area between the source electrode and the drain electrode.

In some embodiments, the impurity concentrations of the plurality of barrier layers in the drift area may be lower than an impurity concentration of the p-type semiconductor layer.

In some embodiments, the impurity concentrations of the plurality of barrier layers in the drift area may be higher than an impurity concentration of the p-type semiconductor layer.

In some embodiments, an impurity concentration of the p-type semiconductor layer in a boundary area between the gate electrode and the p-type semiconductor layer may decrease toward the gate electrode.

In some embodiments, an impurity concentration of the channel layer may be lower than the impurity concentrations of the plurality of barrier layers in the drift area.

In some embodiments, the HEMT may further include a first diffusion barrier layer between the p-type semiconductor layer and the plurality of barrier layers to limit and/or prevent diffusion of impurities.

In some embodiments, the HEMT may further include a second diffusion barrier layer between the plurality of barrier layers and the channel layer to limit and/or prevent diffusion of impurities.

In some embodiments, the plurality of barrier layers may include a first barrier layer adjacent to the p-type semiconductor layer and a second barrier layer adjacent to the channel layer. An impurity concentration of the first barrier layer in the drift area may be higher than an impurity concentration of the second barrier layer. An impurity concentration of the second barrier layer may decrease toward the channel layer. A thickness of the second barrier layer may be greater than a thickness of the first barrier layer. The impurity concentrations of the plurality of barrier layers in the drift area may be lower than an impurity concentration of the p-type semiconductor layer and higher than an impurity concentration of the channel layer. The impurity concentration of the first barrier layer in the drift area may be higher than an impurity concentration of the p-type semiconductor layer.

In some embodiments, the plurality of barrier layers may include a first barrier layer adjacent to the p-type semiconductor layer, a second barrier layer adjacent to the channel layer, and a third barrier layer between the first barrier layer and the second barrier layer, and an impurity concentration of the third barrier layer in the drift area may be higher than an impurity concentration of the first barrier layer. An impurity concentration of the second barrier layer may decrease toward the channel layer. A thickness of the second barrier layer may be greater than a thickness of the first barrier layer and the third barrier layer.

According to an embodiment, an HEMT includes a channel layer, a plurality of barrier layers on a drift area of the channel layer, having an energy band gap greater than that of the channel layer, and including p-type impurities; a p-type semiconductor layer on the plurality of barrier layers; a gate electrode on the p-type semiconductor layer; and a source electrode and a drain electrode outside the drift area of the channel layer. The plurality of barrier layers may include a first barrier layer adjacent to the p-type semiconductor layer and a second barrier layer adjacent to the channel layer. A p-type impurity concentration of the first barrier layer in the drift area may be higher than a p-type impurity concentration of the second barrier layer. A p-type impurity concentration of the channel layer may be lower than the p-type impurity concentration of the first barrier layer and the p-type impurity concentration second barrier layer in the drift area.

In some embodiments, the p-type impurity concentration of the second barrier layer may decrease toward the channel layer.

In some embodiments, the plurality of barrier layers may include a third barrier layer between the first barrier layer and the second barrier layer, and a p-type impurity concentration of the third barrier layer in the drift area may be higher than the p-type impurity concentration of the second barrier layer. An impurity concentration of the p-type semiconductor layer in a boundary area between the gate electrode and the p-type semiconductor layer may decrease toward the gate electrode.

In some embodiments, a diffusion barrier layer that limits and/or prevents diffusion of impurities may be arranged between the p-type semiconductor layer and the first barrier layer and/or between the channel layer and the second barrier layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
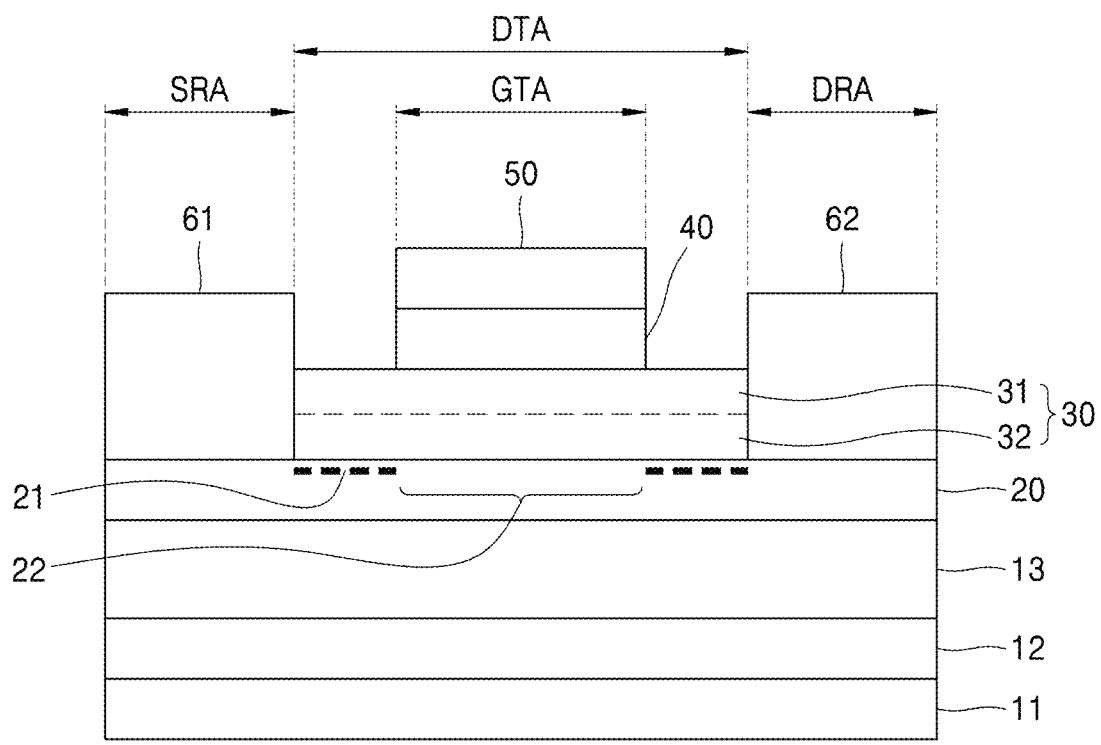
FIG. 1A is a schematic diagram of an off state of a high electron mobility transistor (HEMT), according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of a high electron mobility transistor (HEMT) will be described with reference to the accompanying drawings. The widths and thicknesses of layers or regions illustrated in the accompanying drawings are somewhat exaggerated for the clarity of the specification. The same reference numerals denote the same elements throughout the detailed description.

Figure 1B:
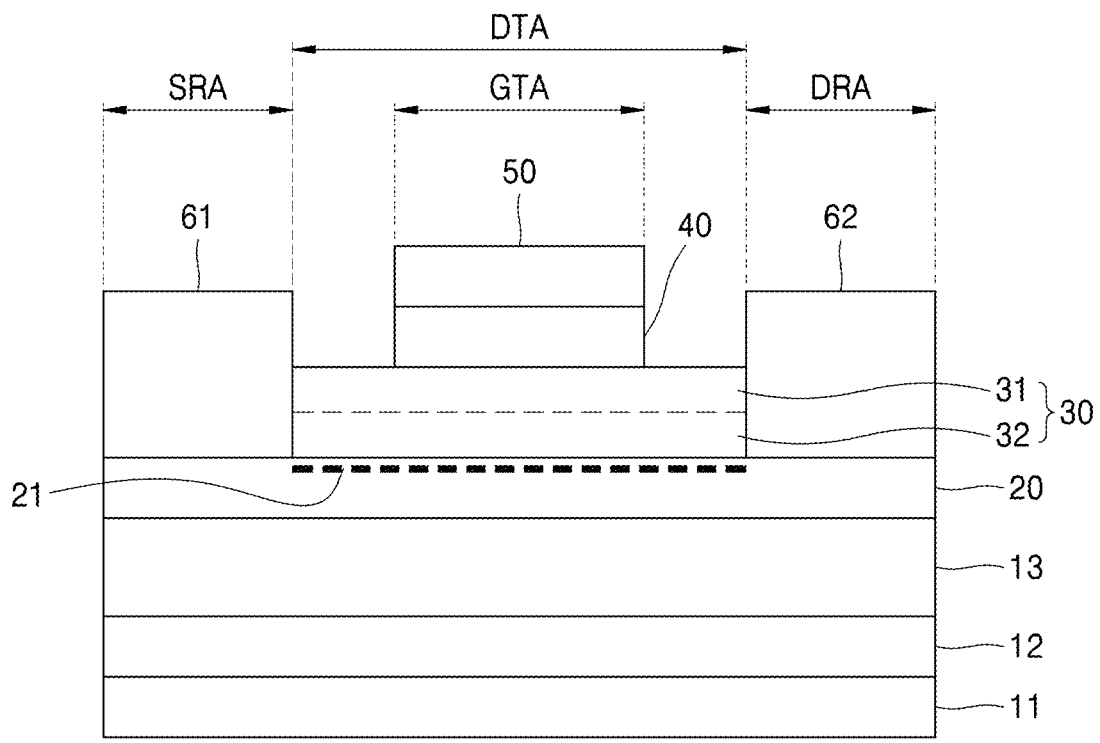
FIG. 1B is a schematic diagram of an on state of the HEMT, according to an embodiment.

FIG. 1A is a schematic diagram of an off state of an HEMT, according to an embodiment. FIG. 1B is a schematic diagram of an on state of the HEMT, according to an embodiment. Referring to FIGS. 1A and 1B, the HEMT according to an embodiment may include a channel layer 20, a barrier layer 30, a p-type semiconductor layer 40, a gate electrode 50, a source electrode 61, and a drain electrode 62. In an embodiment, a seed layer 12 and a buffer layer 13 may be sequentially provided on the substrate 11, and the channel layer 20 may be arranged on the buffer layer 13.

The substrate 11 may include, for example, sapphire, silicon (Si), silicon carbide (SiC), gallium nitride (GaN), and the like. The buffer layer 13 may be arranged on the substrate 11. A certain seed layer 12 may be provided between the substrate 11 and the buffer layer 13. The seed layer 12 may be a base layer for the growth of the buffer layer 13. After the HEMT is manufactured, the substrate 11 and the buffer layer 13 may be removed. The buffer layer 13, the channel layer 20, the barrier layer 30, and the p-type semiconductor layer 40 may include the same material, and may distinguish from each other by relative positions and/or different material compositions from each other.

The buffer layer 13 limits and/or prevents crystalline degradation of the channel layer 20 by reducing a difference in lattice constant and thermal expansion coefficient between the substrate 11 and the channel layer 20. The buffer layer 13 may have a single-layer structure or a multilayer structure including one or more materials selected from nitrides including at least one of Group III-V materials, for example, Al, Ga, and In. The buffer layer 13 may be $Al_xIn_yGa_{1-x-y}N$ ($0 \leq x \leq 1$, $0 \leq y \leq 1$, $x+y \leq 1$). The buffer layer 13 may have a single-layer structure or a multilayer structure including, for example, at least one of AlN, GaN, AlGaN, InGaN, AlInN, and AlGaInN.

The channel layer 20 forms a channel between the source electrode 61 and the drain electrode 62, and the channel layer 20 may include a material capable of forming two-dimensional electronic gas (2DEG) 21 therein. The channel layer 20 may have a single-layer structure or a multilayer structure including one or more materials selected from nitrides including at least one of Group III-V materials, for example, Al, Ga, and In. The channel layer 20 may be $Al_xIn_yGa_{1-x-y}N$ ($0 \leq x \leq 1$, $0 \leq y \leq 1$, $x+y \leq 1$). For example, the channel layer 20 may include at least one of AlN, GaN, InN, InGaN or AlGaN, AlInN, and AlInGaN. The channel layer 20 may be an undoped layer and may be a layer doped with impurities. The channel layer 20 may have a thickness of several hundreds of nm or less.

The barrier layer 30 is arranged on the channel layer 20. The barrier layer 30 is arranged on a drift area DTA of the channel layer 20. The drift area DTA is an area between the source electrode 61 and the drain electrode 62, and is an area in which the carrier movement occurs when a potential difference is generated in the source electrode 61 and the drain electrode 62. As described later, the carrier movement in the drift area DTA may be permitted or blocked according to whether a voltage is applied to the gate electrode 50 and/or the magnitude of the voltage applied to the gate electrode 50.

The barrier layer 30 may include a material having a greater energy band gap than the channel layer 20. For example, the barrier layer 30 may have a multilayer structure including one or more materials selected from nitrides including at least one of Group III-V materials, for example, Al, Ga, and In. The barrier layer 30 may be $Al_xIn_yGa_{1-x-y}N$ ($0 \leq x \leq 1$, $0 \leq y \leq 1$, $x+y \leq 1$). The barrier layer 30 may include at least one of GaN, InN, AlGaN, AlInN, InGaN, AlN, and AlInGaN.

In the present embodiment, the barrier layer 30 has a two-layer structure including a first barrier layer 31 and a second barrier layer 32. The first barrier layer 31 is the uppermost layer among the layers forming the barrier layer 30 and is a layer adjacent to the p-type semiconductor layer 40. The second barrier layer 32 is the lowermost layer among the layers forming the barrier layer 30 and is a layer adjacent to the channel layer 20. The first barrier layer 31 and the second barrier layer 32 may have different energy band gaps from each other. For example, the energy band gap of the first barrier layer 31 may be greater than the energy band gap of the second barrier layer 32. The energy band gaps of the first barrier layer 31 and the second barrier layer 32 may be controlled by a composition ratio of Al and/or In. The first barrier layer 31 and the second barrier layer 32 may have a thickness of several nm or several tens of nm. The thickness of the second barrier layer 32 may be greater than the thickness of the first barrier layer 31.

The first barrier layer 31 is doped with impurities. The impurities may be p-type impurities capable of providing holes. For example, the impurities may include magnesium (Mg). The impurity concentration of the first barrier layer 31 in the drift area DTA may be selected so as to obtain a desired threshold voltage and on-resistance. The second barrier layer 32 may be doped with p-type impurities, for example, Mg. The second barrier layer 32 may not be intentionally doped with impurities and may be doped with impurities diffusing from the first barrier layer 31.

Because the barrier layer 30 has a relatively high energy band gap, compared with the channel layer 20, the barrier layer 30 has a relatively high electrical polarization rate. Therefore, the 2DEG 21 is induced in the channel layer 20 having a relatively low electrical polarization rate. The 2DEG 21 may be formed in the channel layer 20 under the interface between the channel layer 20 and the barrier layer 30. The 2DEG 21 shows a very high electron mobility.

The source electrode 61 and the drain electrode 62 are arranged on the channel layer 20. The source electrode 61 and the drain electrode 62 are arranged outside the drift area DTA on the channel layer 20. The source electrode 61 and the drain electrode 62 are arranged in a source area SRA and a drain area DRA on the channel layer 20, respectively. The source electrode 61 and the drain electrode 62 are in ohmic contact with the channel layer 20. The source electrode 61 and the drain electrode 62 may include an electrically conductive material, for example, a metal material. The source electrode 61 and the drain electrode 62 are apart from each other. The 2DEG 21 formed in the channel layer 20 may be used as a current passage (that is, a channel) between the source electrode 61 and the drain electrode 62.

The p-type semiconductor layer 40 is arranged on the barrier layer 30. The p-type semiconductor layer 40 is arranged on the first barrier layer 31, which is the uppermost layer of the barrier layer 30. The p-type semiconductor layer 40 is apart from the source electrode 61 and the drain electrode 62 between the source electrode 61 and the drain electrode 62. The p-type semiconductor layer 40 may be closer to the source electrode 61 than the drain electrode 62.

The p-type semiconductor layer 40 may have a different energy band gap from the barrier layer 30. The p-type semiconductor layer 40 may include one or more materials selected from nitrides including at least one of Group III-V materials, for example, Al, Ga, and In, as the p-type semiconductor. The p-type semiconductor layer 40 may be $Al_xIn_yGa_{1-x-y}N$ ($0 \leq x \leq 1$, $0 \leq y \leq 1$, $x+y \leq 1$). The p-type semiconductor layer 40 may include at least one of GaN, InN, AlGaN, AlInN, InGaN, AlN, and AlInGaN. The p-type semiconductor layer 40 may be doped with p-type impurities such as magnesium (Mg). For example, the p-type semiconductor layer 40 may be a p-GaN layer or a p-AlGaN layer.

Due to the p-type semiconductor layer 40, the energy band level of the barrier layer 30 in the area (gate area GTA) corresponding to the lower portion of the p-type semiconductor layer 40 may increase, and a depletion region 22 may be formed in a partial area (that is, the gate area GTA) of the drift area DTA of the channel layer 20. Therefore, the carrier, that is, the 2DEG 21, may not be formed in the gate area GTA of the channel layer 20, or may have a lower electron concentration than the remaining areas. Therefore, the current does not flow between the source electrode 61 and the drain electrode 62, and the HEMT has normally-off characteristics. The normally-off characteristics refer to characteristics in which, when a voltage is not applied to the gate electrode 50, that is, in a normal state, the HEMT is in an off state as illustrated in FIG. 1A, and when a voltage is applied to the gate electrode 50, the HEMT is in an on-state as illustrated in FIG. 1B.

The gate electrode 50 is arranged on the p-type semiconductor layer 40. The gate electrode 50 is in ohmic contact with the p-type semiconductor layer 40. The gate electrode 50 may include an electrically conductive material, for example, a metal material. In a state in which a voltage is not applied to the gate electrode 50, the depletion region 22 is formed in the channel layer 20, and no channel is formed by the 2DEG 21. Therefore, as illustrated in FIG. 1A, the HEMT is in an off state in which a current does not flow from the source electrode 61 to the drain electrode 62. When a voltage equal to or higher than a threshold voltage is applied to the gate electrode 50, the concentration of the 2DEG 21 increases in the gate area GTA of the channel layer 20 and the range of the 2DEG 21 extends, so that the depletion region 22 disappears and the channel forms. Therefore, as shown in FIG. 1B, the HEMT is in an on state in which a current flows from the source electrode 61 to the drain electrode 62.

The p-type semiconductor layer 40 may have a thickness of about 30 nm to about 150 nm. When the thickness of the p-type semiconductor layer 40 is less than 30 nm, the depletion region 22 is not formed in the channel layer 20. Thus, normally-on characteristics in which a current flows appear in an off state. When the thickness of the p-type semiconductor layer 40 is greater than 150 nm, the energy band level of the barrier layer 30 is excessively high in the gate area GTA, and thus, a bias voltage applied to the gate electrode 50 may excessively increase so as to set the HEMT to an on state.

The HEMT that is commonly used as a power element requires a high threshold voltage. In addition, it is necessary to reduce the on-resistance so as to implement an HEMT capable of performing a high-speed operation. The threshold voltage and the on-resistance may be controlled by changing the impurity concentration of the p-type semiconductor layer 40. The impurity concentration of the p-type semiconductor layer 40 may affect a gate leakage current. In other words, when the impurity concentration of the p-type semiconductor layer 40 increases, the impurity concentration increases in a boundary between the p-type semiconductor layer 40 and the gate electrode 50, and thus, a gate leakage current may be generated. In addition, when the impurity concentration of the p-type semiconductor layer 40 increases, the impurities diffuse into the channel layer 20. Since it is difficult to control the position of the diffusing impurities, it is not easy to manufacture an HEMT having a desired threshold voltage and on-resistance.

In this regard, in the HEMT according to the present embodiment, the threshold voltage and the on-resistance are controlled by using the impurity concentration of the barrier layer 30 in the drift area DTA. The barrier layer 30 may include a plurality of barrier layers. The barrier layer 30 is doped with impurities. In the drift area DTA, the impurity concentrations of the barrier layers may be different from each other. Hereinafter, unless otherwise specified, the impurity concentration of the barrier layer 30 and the channel layer 20 is the impurity concentration of the drift area DTA.

Figure 2:
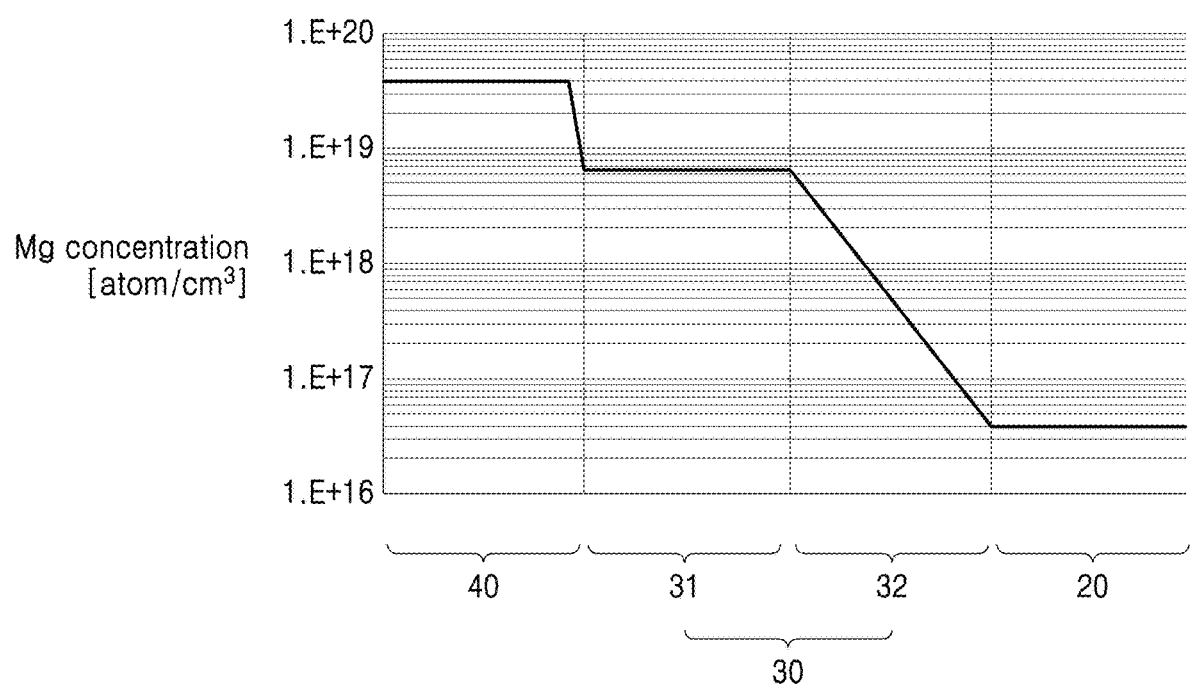
FIG. 2 is a graph showing an example of an impurity concentration distribution in the HEMT illustrated in FIG. 1, according to an embodiment.

FIG. 2 is a graph showing an example of an impurity concentration distribution in the HEMT illustrated in FIG. 1, according to an embodiment. Referring to FIG. 2, the barrier layer 30 includes a first barrier layer 31 and a second barrier layer 32. The first barrier layer 31 is doped with p-type impurities, for example, Mg. As the impurity concentration of the first barrier layer 31 in the drift area DTA is higher, the efficiency of hole injection into the second barrier layer 32 and/or the channel layer 20 may be improved. Therefore, the concentration of the 2DEG 21 of the channel layer 20 may increase and the on-resistance of the HEMT may be reduced. In addition, as the impurity concentration of the first barrier layer 31 in the drift area DTA is higher, the threshold voltage increases. The impurity concentration of the first barrier layer 31 in the drift area DTA may be determined so as to implement a desired threshold voltage and on-resistance. The impurity concentration of the first barrier layer 31 in the drift area DTA may be lower than the impurity concentration of the p-type semiconductor layer 40. Due to this, an HEMT may be implemented which is capable of reducing or preventing a gate leakage current caused by the impurity diffusion into the p-type semiconductor layer 40 and has stable normally-off characteristics. The impurity concentration of the p-type semiconductor layer 40, for example, the Mg concentration may be about $3E+19$ atom/cm$^3$, and the impurity concentration of the first barrier layer 31 in the drift area DTA may be lower than the impurity concentration of the p-type semiconductor layer 40.

In order to control the impurity concentration of the first barrier layer 31 or the first and second barrier layers 31 and 32, a growth interruption (GI) process, a modulation doping process, and the like may be applied when the first and second barrier layers 31 and 32 are epitaxially grown on the channel layer 20. In addition, the amount of impurities may be controlled by supplying impurities to a growth chamber before or after the first and second barrier layers 31 and 32 are grown. In order to control the effective carrier concentration in the barrier layer 30 and the channel layer 20, n-type impurities may be additionally doped into the barrier layer 30 doped with p-type impurities.

Excessive hole injection into the channel layer 20 may deteriorate channel characteristics due to the 2DEG 21. In this regard, the impurity concentration of the second barrier layer 32 in the drift area DTA may be lower than the impurity concentration of the first barrier layer 31. In the drift area DTA, the second barrier layer 32 may be doped with p-type impurities, for example, Mg, so as to have a lower impurity concentration than that of the first barrier layer 31. Of course, the second barrier layer 32 may not be intentionally doped with impurities, and the impurity concentration of the second barrier layer 32 may be determined by the amount of impurities diffusing from the first barrier layer 31. In this case, the impurity concentration of the second barrier layer 32 is lower than the impurity concentration of the first barrier layer 31. The impurity concentration of the second barrier layer 32 may decrease toward the channel layer 20.

In addition, in order to limit and/or prevent excessive hole injection into the channel layer 20, the thickness of the second barrier layer 32 may be greater than the thickness of the first barrier layer 31. For example, the thickness of the second barrier layer 32 may be at least twice the thickness of the first barrier layer 31.

In order to reduce or prevent deterioration of the channel characteristics of the 2DEG 21 due to the impurities in the channel layer 20, the impurity concentration of the channel layer 20 may be lower than the impurity concentration of the barrier layer 30 in the drift area DTA. The impurity concentration of the channel layer 20 may be lower than the impurity concentration of the second barrier layer 32. For example, the impurity concentration of the channel layer 20 may be lower than $1E+17$ atom/cm$^3$.

Figure 3:
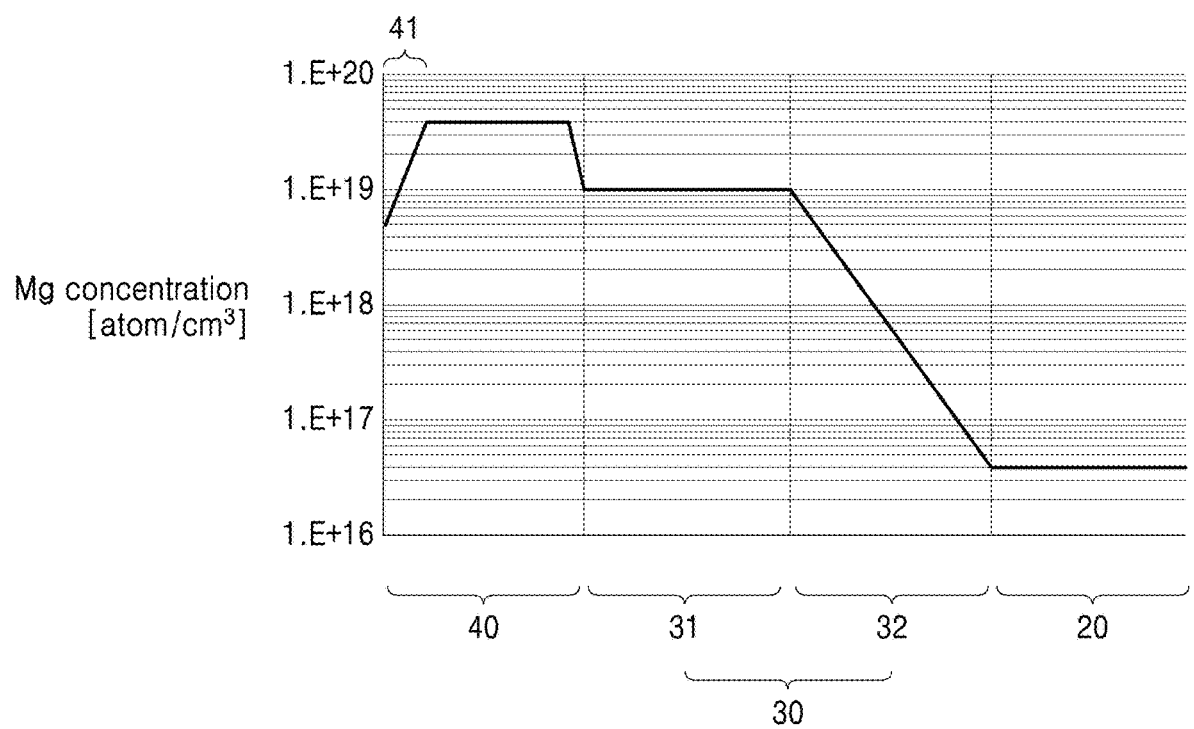
FIG. 3 is a graph showing an example of an impurity concentration distribution in the HEMT illustrated in FIG. 1, according to an embodiment.

FIG. 3 is a graph showing an example of an impurity concentration distribution in the HEMT illustrated in FIG. 1, according to an embodiment. The impurity concentration distribution of the present embodiment differs from the impurity concentration distribution illustrated in FIG. 2 in terms of the impurity concentration distribution of the p-type semiconductor layer 40. Therefore, the description of FIG. 2 may be equally applied to that of FIG. 3, and differences will be mainly described. Referring to FIG. 3, the impurity concentration of the p-type semiconductor layer 40 in a boundary area 41 between the gate electrode 50 and the p-type semiconductor layer 40 may decrease toward the gate electrode 50. According to such a configuration, the impurity concentration in the vicinity of the gate electrode 50 is lowered to reduce the possibility of occurrence of a gate leakage current.

Figure 4:
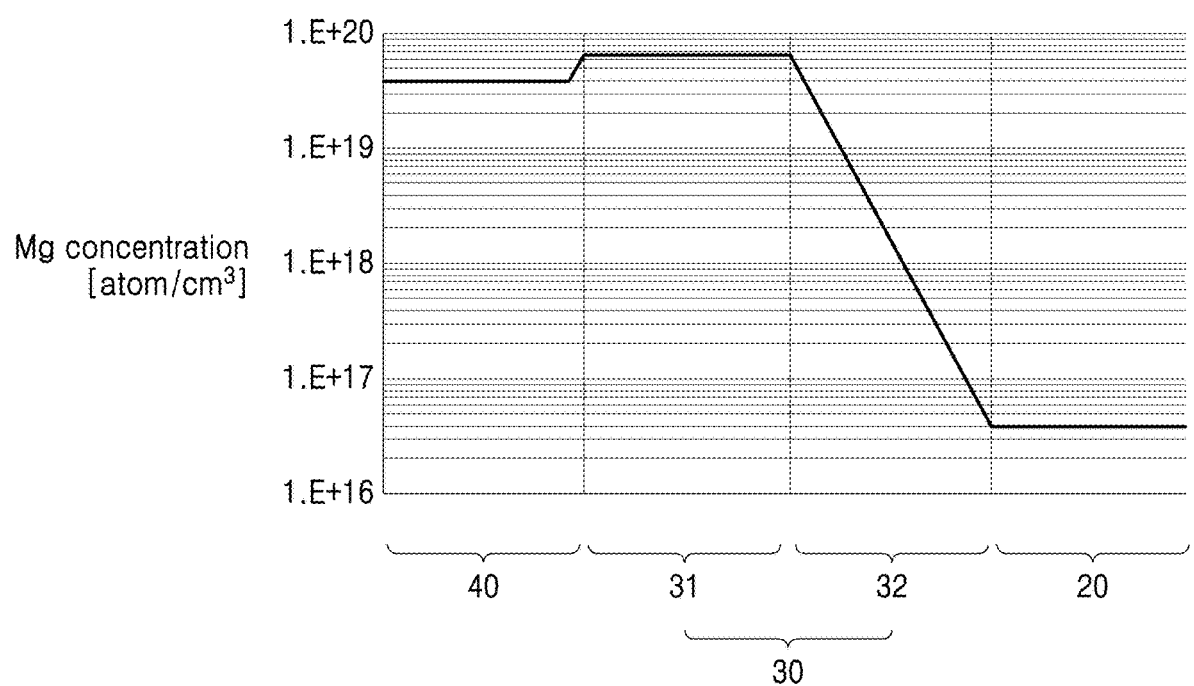
FIG. 4 is a graph showing an example of an impurity concentration distribution in the HEMT illustrated in FIG. 1, according to an embodiment.

FIG. 4 is a graph showing an example of an impurity concentration distribution in the HEMT illustrated in FIG. 1, according to an embodiment. The impurity concentration distribution of the present embodiment differs from the impurity concentration distribution illustrated in FIG. 2 in terms of the impurity concentration distribution of the barrier layer 30. Referring to FIG. 4, the barrier layer 30 includes a first barrier layer 31 and a second barrier layer 32. The first barrier layer 31 is doped with p-type impurities, for example, Mg. The impurity concentration of the first barrier layer 31 in the drift area DTA may be higher than the impurity concentration of the p-type semiconductor layer 40. The impurity concentration of the p-type semiconductor layer 40, for example, the Mg concentration may be about $3E+19$ atom/cm$^3$, and the impurity concentration of the first barrier layer 31 in the drift area DTA may be higher than the impurity concentration of the p-type semiconductor layer 40. As the impurity concentration of the first barrier layer 31 in the drift area DTA increases, a higher energy level is formed at an interface between the barrier layer 30 and the channel layer 20. In this case, since the energy difference (band gap energy difference) between a Fermi-level and an energy level at the interface between the barrier layer 30 and the channel layer 20 increases, a stable threshold voltage may be secured and an HEMT having stable normally-off characteristics may be implemented. When the HEMT is dynamically driven, surface-trapped electrons may increase near the interface between the barrier layer 30 and the channel layer 20, resulting in current collapse. Since the barrier layer 30 is doped with impurities, holes may be injected around the interface between the barrier layer 30 and the channel layer 20 in the drift area DTA. When the HEMT is dynamically driven, electron traps may be generated near the interface between the barrier layer 30 and the channel layer 20. However, electron trap may be reduced by holes provided from the drift area DTA of the first barrier layer 31. Therefore, an HEMT having a low on-resistance and stable normally-off characteristics during dynamic driving may be implemented.

The impurity concentration of the second barrier layer 32 in the drift area DTA may be lower than the impurity concentration of the first barrier layer 31. The second barrier layer 32 may be doped with p-type impurities, for example, Mg, so as to have a lower impurity concentration than that of the first barrier layer 31 in the drift area DTA. Of course, the second barrier layer 32 may not be intentionally doped with impurities, and the impurity concentration of the second barrier layer 32 may be determined by the amount of impurities diffusing from the first barrier layer 31. In this case, the impurity concentration of the second barrier layer 32 is lower than the impurity concentration of the first barrier layer 31. The impurity concentration of the second barrier layer 32 may decrease toward the channel layer 20. In addition, in order to limit and/or prevent excessive hole injection into the channel layer 20, the thickness of the second barrier layer 32 may be greater than the thickness of the first barrier layer 31. For example, the thickness of the second barrier layer 32 may be at least twice the thickness of the first barrier layer 31. In order to reduce or prevent deterioration of the channel characteristics of the 2DEG 21 due to the impurities in the channel layer 20, the impurity concentration of the channel layer 20 may be lower than the impurity concentration of the barrier layer 30 in the drift area DTA. The impurity concentration of the channel layer 20 may be lower than the impurity concentration of the second barrier layer 32. For example, the impurity concentration of the channel layer 20 may be lower than 1E+17 atom/cm$^3$.

Figure 5:
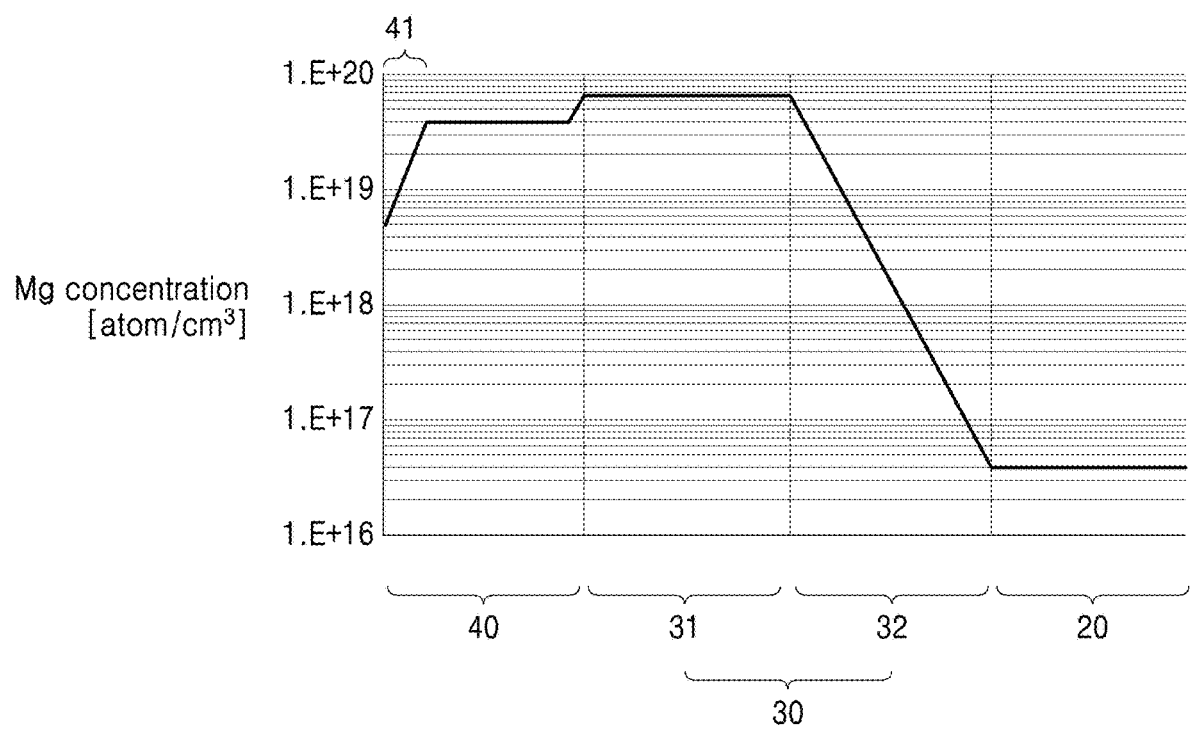
FIG. 5 is a graph showing an example of an impurity concentration distribution in the HEMT illustrated in FIG. 1, according to an embodiment.

FIG. 5 is a graph showing an example of an impurity concentration distribution in the HEMT illustrated in FIG. 1, according to an embodiment. The impurity concentration distribution of the present embodiment differs from the impurity concentration distribution illustrated in FIG. 4 in terms of the impurity concentration distribution of the p-type semiconductor layer 40. Therefore, the description of FIG. 4 may be equally applied to that of FIG. 5, and differences will be mainly described. Referring to FIG. 5, the impurity concentration of the p-type semiconductor layer 40 in a boundary area 41 between the gate electrode 50 and the p-type semiconductor layer 40 may decrease toward the gate electrode 50. According to such a configuration, the impurity concentration in the vicinity of the gate electrode 50 is lowered to reduce the possibility of occurrence of a gate leakage current.

Figure 6:
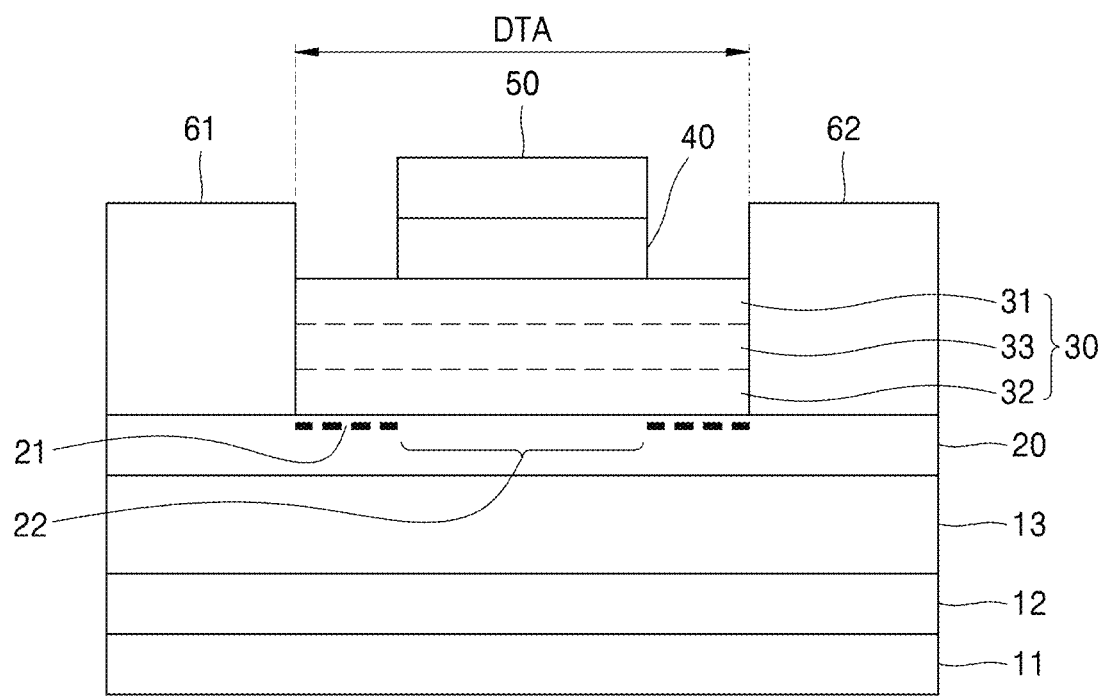
FIG. 6 is a schematic configuration diagram of an HEMT according to an embodiment.

FIG. 6 is a schematic configuration diagram of an HEMT according to an embodiment. The HEMT of the present embodiment differs from the HEMT illustrated in FIG. 1 in that a barrier layer 30 further includes a third barrier layer 33. Therefore, the description of FIG. 1 may be equally applied to that of FIG. 6, and differences will be mainly described. Referring to FIG. 6, a barrier layer 30 includes a first barrier layer 31, a second barrier layer 32, and a third barrier layer 33. In the present embodiment, the barrier layer 30 has a three-layer structure including the first barrier layer 31, the second barrier layer 32, and the third barrier layer 33. The first barrier layer 31 is the uppermost layer among a plurality of layers forming the barrier layer 30 and is a layer adjacent to the p-type semiconductor layer 40. The second barrier layer 32 is the lowermost layer among the layers forming the barrier layer 30 and is a layer adjacent to the channel layer 20. The third barrier layer 33 is arranged between the first barrier layer 31 and the second barrier layer 32. The first barrier layer 31 may be doped with impurities. The impurities may be p-type impurities capable of providing holes. For example, the impurities may include magnesium (Mg). The third barrier layer 33 may be doped with p-type impurities capable of providing holes, for example, Mg. The impurity concentrations of the first and third barrier layers 31 and 33 in the drift area DTA may be selected so as to obtain a desired threshold voltage and on-resistance. The second barrier layer 32 may be doped with p-type impurities, for example, Mg. The second barrier layer 32 may not be intentionally doped with impurities and may be doped with impurities diffusing from the first and third barrier layers 31 and 33. In some embodiments, a thickness of the second barrier layer 32 may be greater than a thickness of the first barrier layer 31 and a thickness of the third barrier layer 33.

Figure 7:
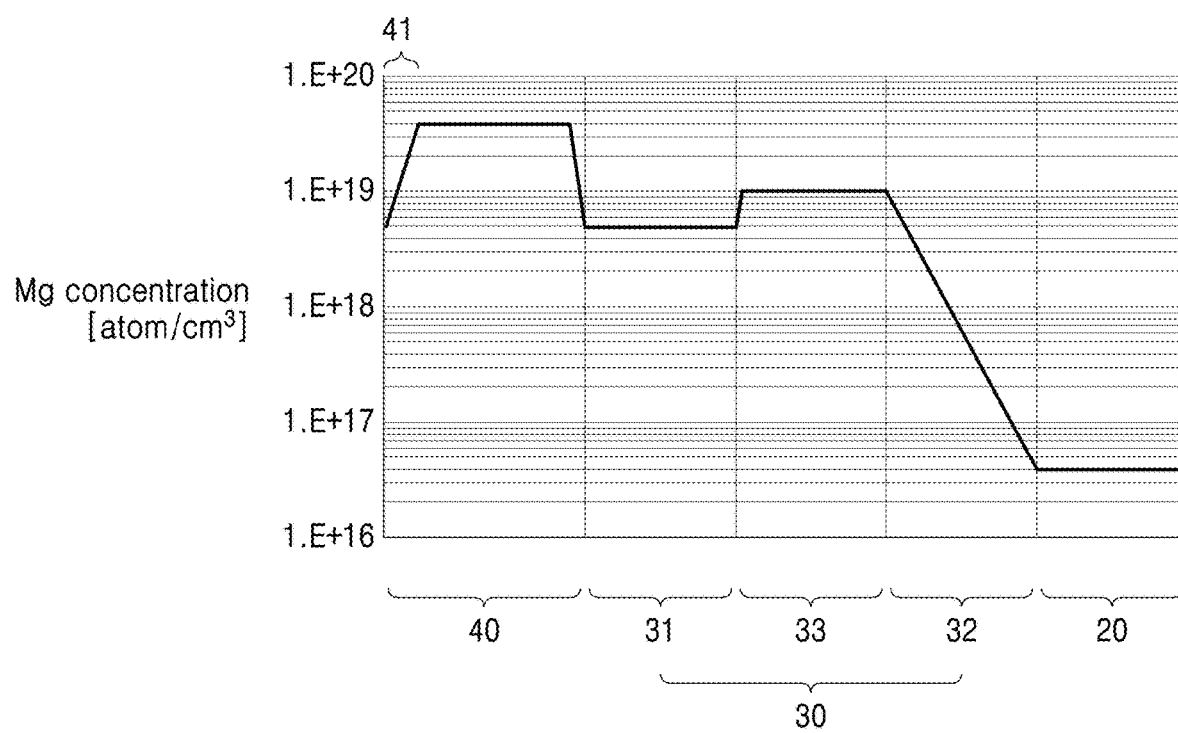
FIG. 7 is a graph showing an example of an impurity concentration distribution in the HEMT illustrated in FIG. 6, according to an embodiment.

FIG. 7 is a graph showing an example of an impurity concentration distribution in the HEMT illustrated in FIG. 6, according to an embodiment. Referring to FIG. 7, a barrier layer 30 includes a first barrier layer 31, a second barrier layer 32, and a third barrier layer 33. The first, second, and third barrier layers 31, 32, and 33 may have different energy band gaps from each other. For example, the energy band gap of the first barrier layer 31 may be greater than the energy band gap of each of the second and third barrier layers 32 and 33. The energy band gap of the third barrier layer 33 may be greater than or less than the energy band gap of the second barrier layer 32. The energy band gaps of the first, second, and third barrier layers 31, 32, and 33 may be controlled by a composition ratio of Al and/or In. Each of the first, second, and third barrier layers 31, 32, and 33 may have a thickness of several nm to several tens of nm.

The first barrier layer 31 and the third barrier layer 33 are doped with p-type impurities, for example, Mg. As the impurity concentrations of the first and third barrier layers 31 and 33 in the drift area DTA are higher, the efficiency of hole injection into the second barrier layer 32 and/or the channel layer 20 may be improved. Therefore, the concentration of the 2DEG 21 of the channel layer 20 may increase and the on-resistance of the HEMT may be reduced. In addition, as the impurity concentrations of the first and third barrier layers 31 and 33 in the drift area DTA are higher, the threshold voltage increases. The impurity concentrations of the first and third barrier layers 31 and 33 in the drift area DTA may be determined so as to implement a desired threshold voltage and on-resistance. By controlling the impurity concentrations of the first and third barrier layers 31 and 33 in the drift area DTA, the threshold voltage and the on-resistance may be controlled more precisely.

The impurity concentrations of the first and third barrier layers 31 and 33 in the drift area DTA may be lower than the impurity concentration of the p-type semiconductor layer 40. In addition, the impurity concentration of the third barrier layer 33 in the drift area DTA may be higher than the impurity concentration of the first barrier layer 31. By lowering the impurity concentration of the first barrier layer 31 close to the p-type semiconductor layer 40, an HEMT may be implemented which is capable of reducing or preventing a gate leakage current caused by the impurity diffusion into the p-type semiconductor layer 40 and has stable normally-off characteristics. The impurity concentration of the p-type semiconductor layer 40, for example, the Mg concentration may be about $3E+19$ atom/cm$^3$, and the impurity concentration of the first barrier layer 31 in the drift area DTA may be lower than the impurity concentration of the p-type semiconductor layer 40.

The impurity concentration of the second barrier layer 32 in the drift area DTA may be lower than the impurity concentration of the third barrier layer 33. The impurity concentration of the second barrier layer 32 in the drift area DTA may decrease toward the channel layer 20. The second barrier layer 32 may be doped with a p-type impurity, for example, Mg, so as to have a lower impurity concentration than that of the third barrier layer 33. Of course, the second barrier layer 32 may not be intentionally doped with impurities, and the impurity concentration of the second barrier layer 32 may be determined by the amount of impurities diffusing from the first and third barrier layers 31 and 33. In order to limit and/or prevent excessive hole injection into the channel layer 20, the thickness of the second barrier layer 32 may be greater than the thickness of the first barrier layer 31. The thickness of the second barrier layer 32 may be greater than the sum of the thicknesses of the first and third barrier layers 31 and 33. For example, the thickness of the second barrier layer 32 may be at least twice the sum of the thicknesses of the first and third barrier layers 31 and 33. The impurity concentration of the channel layer 20 may be lower than the impurity concentration of the second barrier layer 32. For example, the impurity concentration of the channel layer 20 may be lower than $1E+17$ atom/cm$^3$.

In order to control the impurity concentrations of the first, second, and third barrier layers 31, 32, and 33, a GI process, a modulation doping process, and the like may be applied when the first, second, and third barrier layers 31, 32, and 33 are epitaxially grown on the channel layer 20. In addition, the amount of impurities may be controlled by supplying impurities to a growth chamber before or after the first, second, and third barrier layers 31, 32, and 33 are grown. In order to control the effective carrier concentration in the barrier layer 30 and the channel layer 20, n-type impurities may be additionally doped into the barrier layer 30 doped with p-type impurities.

Referring to FIG. 7, the impurity concentration of the p-type semiconductor layer 40 in a boundary area 41 between the gate electrode 50 and the p-type semiconductor layer 40 may decrease toward the gate electrode 50. According to such a configuration, the impurity concentration in the vicinity of the gate electrode 50 is lowered to reduce the possibility of occurrence of a gate leakage current.

Although not illustrated in the drawings, the barrier layer 30 may have a structure of four or more layers. In this case, the impurity concentration relationship and the thickness relationship between the first barrier layer 31 and the second barrier layer 32 may be applied in the same manner as in the above-described embodiments.

Figure 8:
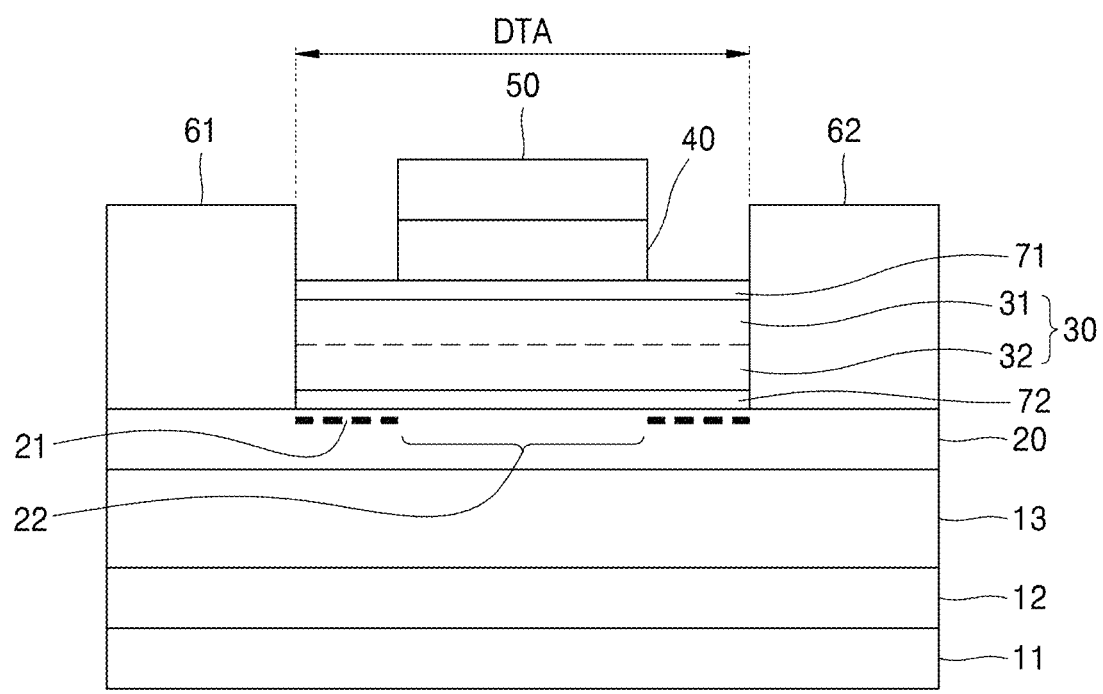
FIG. 8 is a schematic configuration diagram of an HEMT according to an embodiment.

FIG. 8 is a schematic configuration diagram of an HEMT according to an embodiment. The HEMT of the present embodiment differs from the HEMT illustrated in FIG. 1 in that the HEMT of the present embodiment has a structure capable of limiting and/or preventing diffusion of impurities from a barrier layer 30 to other material layers. A diffusion barrier layer that limits and/or prevents diffusion of impurities may be arranged between a p-type semiconductor layer 40 and a first barrier layer 31 and/or between a channel layer 20 and a second barrier layer 32. The description of FIG. 1 may be equally applied to that of FIG. 8, and differences will be mainly described.

As described above, the impurity concentration of the p-type semiconductor layer 40 may affect a gate leakage current. When impurities diffuse from the barrier layer 30 to the p-type semiconductor layer 40, the impurity concentration of the p-type semiconductor layer 40 may increase to cause a gate leakage current. In addition, when impurities diffuse from the barrier layer 30 to the p-type semiconductor layer 40, the impurity concentration of the barrier layer 30 is lowered, and thus, a desired threshold voltage or on-resistance may not be implemented. In this regard, referring to FIG. 8, a first diffusion barrier layer 71 that limits and/or prevents diffusion of impurities may be provided between the p-type semiconductor layer 40 and the barrier layer 30. The first diffusion barrier layer 71 may be arranged between the p-type semiconductor layer 40 and the first barrier layer 31, which is the uppermost layer among a plurality of layers forming the barrier layer 30. The first diffusion barrier layer 71 may include one or more materials selected from nitrides including at least one of Group III-V materials, for example, Al, Ga, and In. The first diffusion barrier layer 71 may be an undoped material layer. The first diffusion barrier layer 71 may be undoped $Al_xIn_yGa_{1-x-y}N$ ($0 \leq x \leq 1$, $0 \leq y \leq 1$, $x+y \leq 1$). The first diffusion barrier layer 71 may include at least one of GaN, InN, AlGaN, AlInN, InGaN, AlN, and AlInGaN.

An excessive impurity concentration of the channel layer 20 may deteriorate characteristics of a 2DEG channel. When impurities diffuse from the barrier layer 30 to the channel layer 20, the impurity concentration of the channel layer 20 increase to deteriorate the characteristics of the 2DEG channel. Also the impurity concentration of the barrier layer 30 is lowered, and thus, a desired threshold voltage or on-resistance may not be implemented. In this regard, referring to FIG. 8, a second diffusion barrier layer 72 that limits and/or prevents diffusion of impurities may be provided between the channel layer 20 and the barrier layer 30. The second diffusion barrier layer 72 may be arranged between the channel layer 20 and the second barrier layer 32, which is the lowermost layer among a plurality of layers forming the barrier layer 30. The second diffusion barrier layer 72 may include one or more materials selected from nitrides including at least one of Group III-V materials, for example, Al, Ga, and In. The second diffusion barrier layer 72 may be an undoped material layer. The second diffusion barrier layer 72 may be undoped $Al_xIn_yGa_{1-x-y}N$ ($0 \leq x \leq 1$, $0 \leq y \leq 1$, $x+y \leq 1$). The second diffusion barrier layer 72 may include at least one of GaN, InN, AlGaN, AlInN, InGaN, AlN, and AlInGaN.

Figure 9:
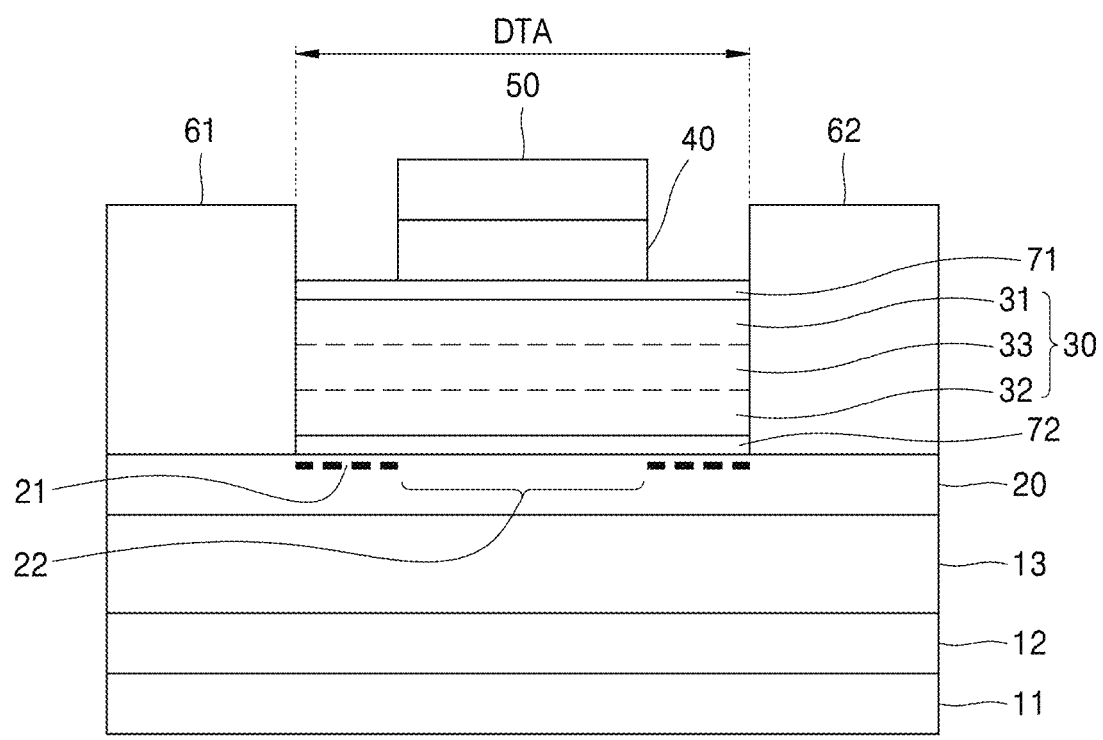
FIG. 9 is a schematic configuration diagram of an HEMT according to an embodiment.

FIG. 9 is a schematic configuration diagram of an HEMT according to an embodiment. The HEMT of the present embodiment differs from the HEMT illustrated in FIG. 8 in that a barrier layer 30 has a three-layer structure including first, second, and third barrier layers 31, 32, and 33. Therefore, the description of FIG. 8 may be equally applied to that of FIG. 9.

By controlling the impurity concentrations of the barrier layers in the drift area, the energy difference (band gap energy difference) between the energy level at the interface between the barrier layer and the channel layer and the Fermi-level may increase. Therefore, since the possibility of occurrence of a leakage current is reduced and a stable threshold voltage is secured, the HEMT having stable normally-off characteristics may be implemented.

In addition, due to the holes provided by the impurities doped in the barrier layers in the drift area, electron trap generated during the dynamic driving of the HEMT is reduced. Therefore, the HEMT having a low on-resistance and stable normally-off characteristic during the dynamic driving may be implemented.

Although many matters have been specifically described in the above description, they should be construed as examples of specific embodiments rather than limiting the scope of the present disclosure. For example, those of ordinary skill in the art will appreciate that the structure of the HEMT in the drawings may be variously modified. Also, those of ordinary skill in the art will appreciate that a method of manufacturing the HEMT illustrated in the drawings may be variously modified. In addition, those of ordinary skill in the art will appreciate that the idea of the present disclosure may be applied to other semiconductor devices other than the HEMT. Therefore, the scope of the present disclosure should not be determined by the above-described embodiments, but should be determined by the technical idea described in the claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A high electron mobility transistor (HEMT) comprising:
   a channel layer;
   a plurality of barrier layers on the channel layer and having an energy band gap greater than that of the channel layer;
   a p-type semiconductor layer on the plurality of barrier layers;
   a gate electrode on the p-type semiconductor layer; and
   a source electrode and a drain electrode spaced apart from the gate electrode on the channel layer,
   wherein impurity concentrations of the plurality of barrier layers are different from each other in a drift area between the source electrode and the drain electrode,
   wherein the plurality of barrier layers include a first barrier layer on a second barrier layer,
   a width of the first barrier layer is different than a width of the p-type semiconductor layer,
   the second barrier layer is between the first barrier layer and the channel layer,
   an impurity concentration of the first barrier layer is different than an impurity concentration of the p-type semiconductor layer and different than an impurity concentration of the second barrier layer, and
   the impurity concentration of the second barrier layer decreases in a thickness direction of the second barrier layer toward the channel layer.

2. The HEMT of claim 1,
   wherein the impurity concentrations of the plurality of barrier layers in the drift area are lower than an impurity concentration of the p-type semiconductor layer.

3. The HEMT of claim 1,
   wherein the impurity concentration of the first barrier layer is higher than the impurity concentration of the p-type semiconductor layer.

4. The HEMT of claim 1,
   wherein the impurity concentration of the p-type semiconductor layer in a boundary area between the gate electrode and the p-type semiconductor layer decreases toward the gate electrode.

5. The HEMT of claim 1,
   wherein an impurity concentration of the channel layer is lower than the impurity concentrations of the plurality of barrier layers in the drift area.

6. The HEMT of claim 1, further comprising:
   a first diffusion barrier layer between the p-type semiconductor layer and the plurality of barrier layers to prevent diffusion of impurities.

7. The HEMT of claim 1, further comprising:
   a second diffusion barrier layer between the plurality of barrier layers and the channel layer to prevent diffusion of impurities.

8. A high electron mobility transistor (HEMT) comprising:
   a channel layer;
   a plurality of barrier layers on the channel layer and having an energy band gap greater than that of the channel layer;
   a p-type semiconductor layer on the plurality of barrier layers;
   a gate electrode on the p-type semiconductor layer; and
   a source electrode and a drain electrode spaced apart from the gate electrode on the channel layer,
   wherein impurity concentrations of the plurality of barrier layers are different from each other in a drift area between the source electrode and the drain electrode,
   wherein the plurality of barrier layers comprise a first barrier layer adjacent to the p-type semiconductor layer and a second barrier layer adjacent to the channel layer, and
   an impurity concentration of the first barrier layer in the drift area is higher than an impurity concentration of the second barrier layer.

9. The HEMT of claim 8,
   wherein an impurity concentration of the second barrier layer decreases toward the channel layer.

10. The HEMT of claim 8,
    wherein a thickness of the second barrier layer is greater than a thickness of the first barrier layer.

11. The HEMT of claim 8,
    wherein the impurity concentrations of the plurality of barrier layers in the drift area are lower than an impurity concentration of the p-type semiconductor layer and higher than an impurity concentration of the channel layer.

12. The HEMT of claim 8,
    wherein the impurity concentration of the first barrier layer in the drift area is higher than an impurity concentration of the p-type semiconductor layer.

13. The HEMT of claim 8,
    wherein the plurality of barrier layers are on a drift area of the channel layer,
    the plurality of barrier layers include p-type impurities such that the impurity concentration of the first barrier layer in the drift area is a p-type impurity concentration of the first barrier layer in the drift area and the impurity concentration of the second barrier layer is a p-type impurity concentration of the second barrier layer in the drift area,
    the source electrode and the drain electrode outside the drift area of the channel layer, the p-type impurity concentration of the first barrier layer in the drift area is higher than the p-type impurity concentration of the second barrier layer in the drift area, and a p-type impurity concentration of the channel layer is lower than the p-type impurity concentration of the first barrier layer in the drift area and the p-type impurity concentration of the second barrier layer in the drift area.

14. The HEMT of claim 13,
wherein the p-type impurity concentration of the second barrier layer decreases toward the channel layer.

15. The HEMT of claim 13,
wherein the plurality of barrier layers comprise a third barrier layer between the first barrier layer and the second barrier layer, and
a p-type impurity concentration of the third barrier layer in the drift area is higher than the p-type impurity concentration of the second barrier layer.

16. The HEMT of claim 13,
wherein an impurity concentration of the p-type semiconductor layer in a boundary area between the gate electrode and the p-type semiconductor layer decreases toward the gate electrode.

17. The HEMT of claim 13, further comprising:
a diffusion barrier layer configured to prevent diffusion of impurities, wherein
the diffusion barrier layer is between the p-type semiconductor layer and the first barrier layer,
the diffusion barrier layer is between the channel layer and the second barrier layer, or
the diffusion barrier layer is between the p-type semiconductor layer and the first barrier layer and the diffusion barrier layer is between the channel layer and the second barrier layer.

18. A high electron mobility transistor (HEMT) comprising:
a channel layer;
a plurality of barrier layers on the channel layer and having an energy band gap greater than that of the channel layer;
a p-type semiconductor layer on the plurality of barrier layers;
a gate electrode on the p-type semiconductor layer; and
a source electrode and a drain electrode spaced apart from the gate electrode on the channel layer,
wherein impurity concentrations of the plurality of barrier layers are different from each other in a drift area between the source electrode and the drain electrode,
the plurality of barrier layers comprise a first barrier layer adjacent to the p-type semiconductor layer, a second barrier layer adjacent to the channel layer, and a third barrier layer between the first barrier layer and the second barrier layer, and
an impurity concentration of the third barrier layer in the drift area is higher than an impurity concentration of the first barrier layer.

19. The HEMT of claim 18,
wherein an impurity concentration of the second barrier layer decreases toward the channel layer.

20. The HEMT of claim 18,
wherein a thickness of the second barrier layer is greater than a thickness of the first barrier layer and a thickness of the third barrier layer.

* * * * *